(12) United States Patent
Farrell et al.

(10) Patent No.: US 8,498,015 B2
(45) Date of Patent: Jul. 30, 2013

(54) CONTROLLING DFE COLOR MANAGEMENT BEHAVIOR IN A DISTRIBUTED SYSTEM

(75) Inventors: Michael E. Farrell, Webster, NY (US); Javier A. Morales, Rochester, NY (US); Patrick Harrington, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 1518 days.

(21) Appl. No.: 11/891,788

(22) Filed: Aug. 13, 2007

(65) Prior Publication Data

US 2009/0046305 A1    Feb. 19, 2009

(51) Int. Cl.
*H04N 1/60* (2006.01)
*G03F 3/08* (2006.01)

(52) U.S. Cl.
USPC ............................... 358/1.9; 358/518

(58) Field of Classification Search
USPC .................... 358/1.15, 1.1, 1.9, 518
See application file for complete search history.

(56) References Cited

U.S. PATENT DOCUMENTS

| | | | |
|---|---|---|---|
| 2004/0174548 A1* | 9/2004 | Ono | 358/1.9 |
| 2005/0280847 A1* | 12/2005 | Cairns et al. | 358/1.9 |
| 2006/0092445 A1* | 5/2006 | Muramatsu | 358/1.9 |
| 2007/0027979 A1* | 2/2007 | Emerson et al. | 709/224 |

* cited by examiner

*Primary Examiner* — Dov Popovici
(74) *Attorney, Agent, or Firm* — Richard H. Krukar; Kermit D. Lopez; Luis M. Ortiz

(57) ABSTRACT

A document specification is examined to determine if it matches the device color characterization of a rendering device such as a printer. If it matches, then the document can be faithfully rendered by the device. Otherwise, the document specification must be transformed before rendering. A match can be detected by discovering a appropriate metadata within the document specification or within the document color characterization. Alternatively, a device signature can be used instead of a metadata.

14 Claims, 5 Drawing Sheets

CONTROLLING DFE COLOR MANAGEMENT BEHAVIOR IN A DISTRIBUTED SYSTEM

TECHNICAL FIELD

Embodiments relate to the fields of printed documents, electronic documents, and printing. Embodiments also relate to the fields of color printing, color display, and color rendering. Embodiments further relate to the fields of color device characterization and color space transformations.

BACKGROUND

A document's life cycle can include many phases including creation, editing, amending, rendering, publication, distribution, and reading. During many of the phases, a document typically exists in the form of a document specifications stored on a server computer or other networked device. In order for anyone to read or otherwise use a document, it must be rendered by a rendering device such as a printer or a computer display.

Rendering devices are often characterized on how they produce certain colors, tones, textures, and shades. For example, a cyan-magenta-yellow (CMY) printer can not produce as deep a black as a black and white printer or a cyan-magenta-yellow-black (CMYK) printer. Similarly, computer displays typically work in a red-green-blue (RGB) color space and have their own characteristics. Regardless of the rendering device's characteristics, a document should look the same.

Color characterizations can be used to ensure that documents look the same regardless of the rendering device. A document can have a document color characterization while a rendering device can have a device color characterization. A color transform can alter one color characterization based on another color characterization. As such, a document color characterization can be altered based on a device color characterization. The result is that the document renders faithfully on the device.

It is possible, however, to color transform a document many times. For example, a document can be transformed once for printing and then again for printing on the same device. The second rendering will be off because it is a transformation of the first, correct, one. This issue can be avoided by retaining documents only when they have a specific standardized document color characterization. Regardless, transformed documents are still accidentally retained. Another issue is that every document must be transformed prior to rendering, thereby requiring and consuming computing resources. Systems and methods to address the shortcomings of current technology are needed.

BRIEF SUMMARY

Aspects of the embodiments address limitations and flaws in the prior art by automatically detecting document color characterizations that already match a device color characterization.

It is therefore an aspect of the embodiments to provide for examining a document specification. A document color characterization is associated with the document specification. The examination reveals whether or not the document color characterization matches a device color characterization. If the color characterizations do not match, then the document specification is transformed so that they do. Once the color characterizations match, the document can be faithfully rendered by the rendering device that is associated with the device color characterization.

A document color characterization and a device color characterization match when the rendering device will faithfully render the document. There are a variety of ways to ensure or indicate this. One way is to transform the document color characterization. Another way is to transform the actual pixel data in the document specification. Metadata can be added to either, or both of, the document color characterization or the document specification. The metadata can indicate which, if any, devices can currently faithfully render the document. Alternatively, a device signature can be sought in the document specification or the document color characterization. Those practiced in the art of printing or electronic documents are familiar with document specifications, document specification formats, metadata, color spaces, color transforms, and color characterizations.

It is another aspect of certain embodiments to automatically adjust or transform documents that are already in a device's preferred color space such as CMYK. As such, resources are not expended on documents that are not intended for that rendering device or that can not be properly rendered on that device.

BRIEF DESCRIPTION OF THE DRAWINGS

The accompanying figures, in which like reference numerals refer to identical or functionally similar elements throughout the separate views and which are incorporated in and form a part of the specification, further illustrate the present invention and, together with the background of the invention, brief summary of the invention, and detailed description of the invention, serve to explain the principles of the present invention.

DETAILED DESCRIPTION OF THE INVENTION

The particular values and configurations discussed in these non-limiting examples can be varied and are cited merely to illustrate embodiments and are not intended to limit the scope of the invention.

A document specification is examined to determine if it matches the device color characterization of a rendering device such as a printer. If it matches, then the document can be faithfully rendered by the device. Otherwise, the document specification must be transformed before rendering. A match can be detected by discovering appropriate metadata within the document specification or within the document color characterization. A device signature can be used instead of metadata or in addition to metadata. For example, a device signature can be sought after failing to find the appropriate metadata.

Figure 1:
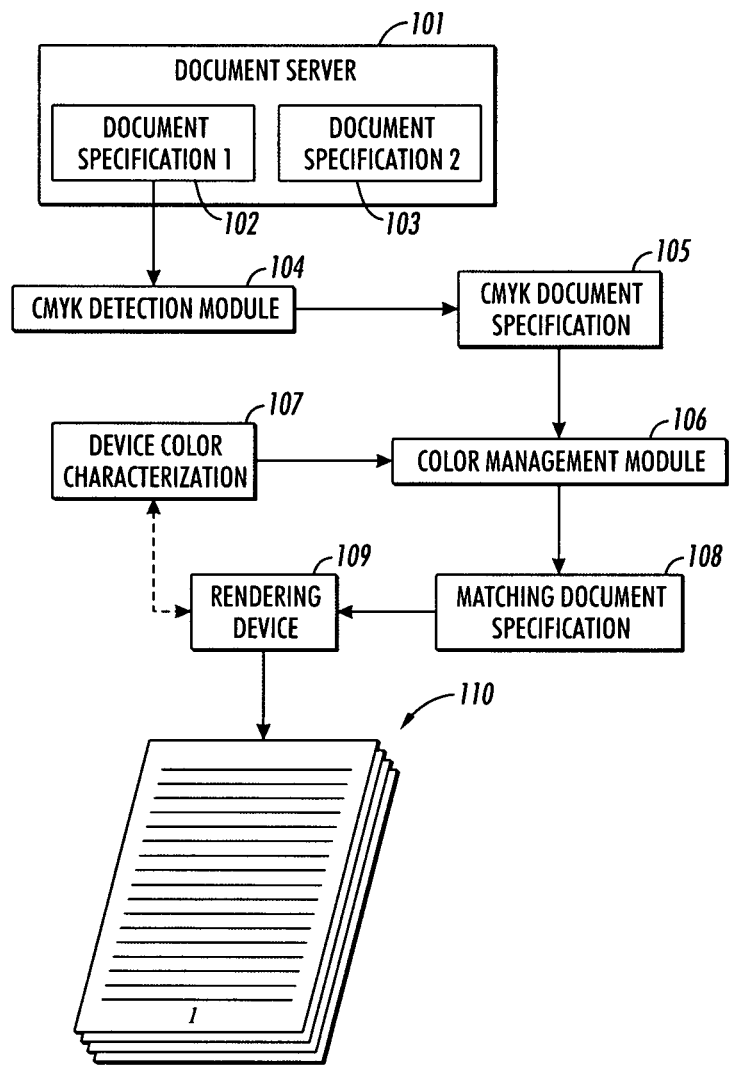
FIG. 1 illustrates a system that automatically transforms document specifications in accordance with aspects of the embodiments.

FIG. 1 illustrates a system that automatically transforms document specifications in accordance with aspects of the embodiments. A document server 101 can store document specifications 102, 103. A person can desire to view document 1 and thereby cause it to be rendered. Document specification 1 102 is passed to a CMYK detection module 104. In the illustrated embodiment, only those documents in the CMYK-color space can be rendered. As such, a non-CMYK document specification is not processed further while, perhaps, an error message is returned to the person. Other embodiments can handle other color spaces such as RGB and even contain modules for transforming from one color space to another.

If it is in the CMYK color space, then document specification 1 102 is a CMYK document specification 105 and is passed to a color management module 106. The color management module 106 determines if the CMYK document specification matches the device color characterization 107 associated with a rendering device 109. A non-matching document specification can be transformed into a matching document specification 108. A document specification that already matches does not need to be transformed because it already is a matching document specification. The rendering device 109 renders the matching document specification 108 to produce a document 110.

Figure 2:
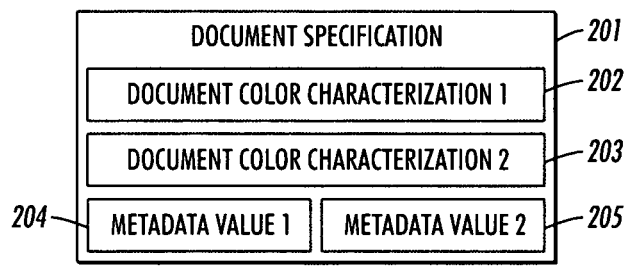
FIG. 2 illustrates document color characterizations stored within a document specification in accordance with aspects of the embodiments.

FIG. 2 illustrates document color characterizations 202, 203 stored within a document specification 201 in accordance with aspects of the embodiments. Two document color characterizations are shown solely for illustrative purposes. Many document specifications can have only one document color characterizations while other can have more than two. Some document specifications contain no document color characterization but can be associated with one or more. The association can be established with metadata, a pointer, or some other type of reference.

The documents specification is also illustrated as containing metadata value 1 204 and metadata value 2 205. Metadata value 1 204 can indicate that document color characterization 1 202 can be used to faithfully render the document on a certain printer. Metadata value 2 205 can indicate that document color characterization 2 203 can be used to faithfully render the document on a certain display.

Figure 3:
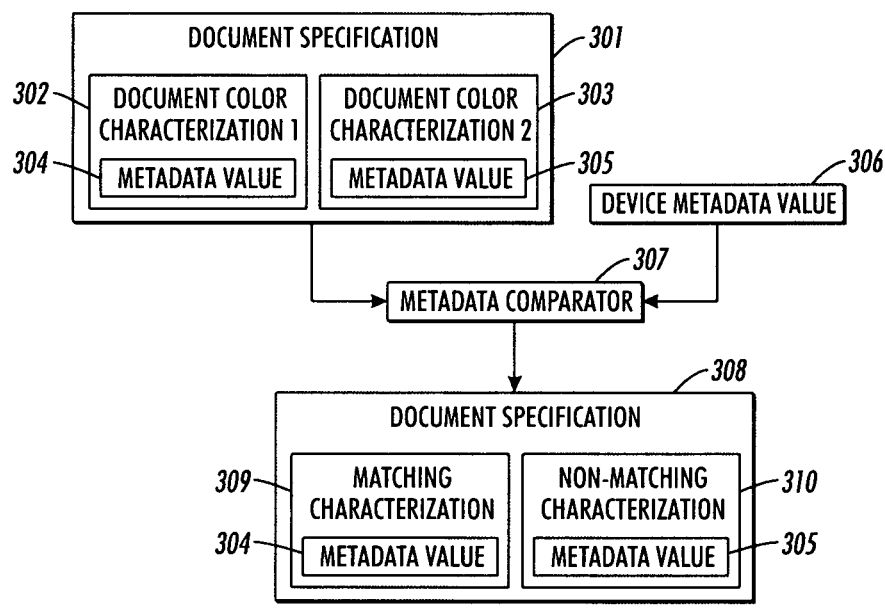
FIG. 3 illustrates metadata comparisons in accordance with aspects of the embodiments.

FIG. 3 illustrates metadata comparisons in accordance with aspects of the embodiments. Document specification 301 is shown as containing two document color characterizations 302, 303 in order to help illustrate different treatments for different document color characterizations. Unlike the FIG. 2 document color characterizations 202, 203, The FIG. 3 embodiment has document color characterizations containing the metadata values 304, 305 indicating matching rendering devices because containment is one method of association.

A metadata comparator 307 compares the metadata values 304, 305 to a device metadata value 306 and discovers that document color characterization 1 302 matches while document color characterization 2 303 does not. As such, document specification 308 has a matching characterization 309 and a nonmatching characterization 310.

Figure 4:
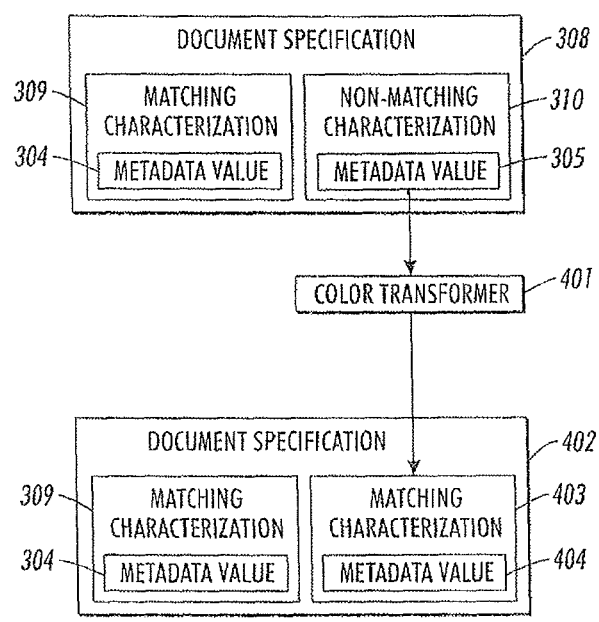
FIG. 4 illustrates transforming a document specification in accordance with aspects of the embodiments.

FIG. 4 illustrates transforming a document specification 308 in accordance with aspects of the embodiments. Notice that FIG. 4 begins where FIG. 3 left off. A color transformer 401 operates on the nonmatching characterization 310 to produce matching characterization 403. The metadata value 404 is altered to indicate the match. The document specification 402 now contains two matching characterizations 309, 403.

Figure 5:
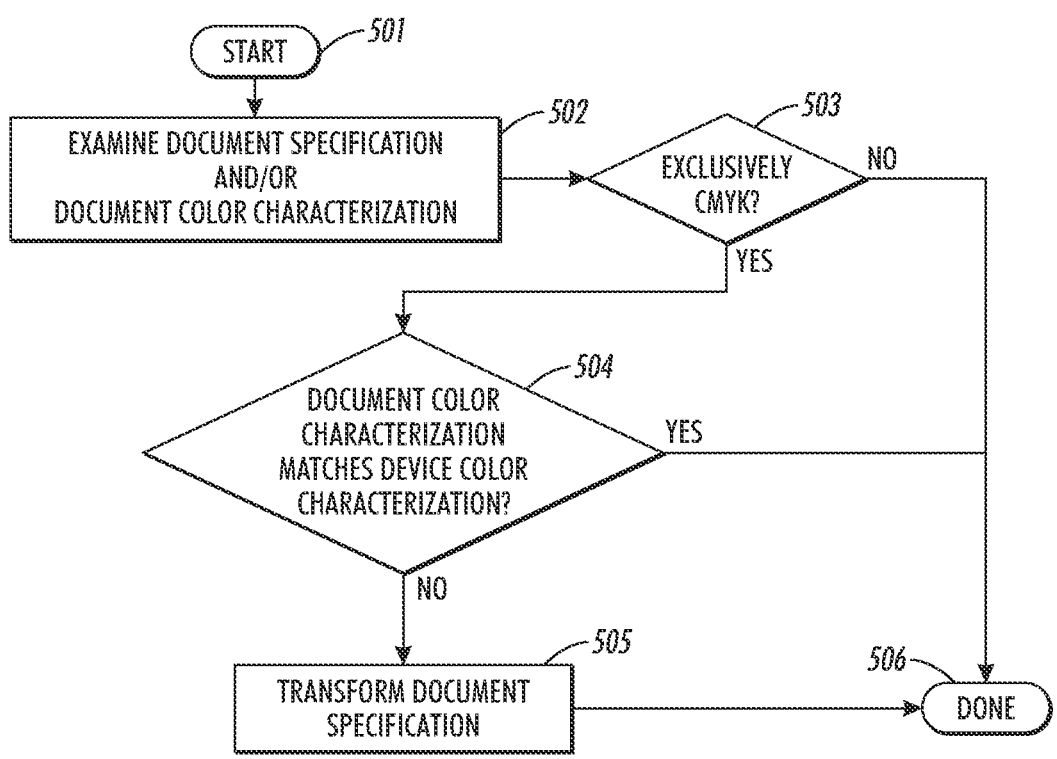
FIG. 5 illustrates a high level flow diagram of transforming a document specification in accordance with aspects of the embodiments.

FIG. 5 illustrates a high level flow diagram of transforming a document specification in accordance with aspects of the embodiments. After the start 501, the document specification or document color specification is examined 502. Some document specifications are associated with but do not contain a document color specification. In some of those cases, the associated document color characterization must be obtained and examined. If the document is not exclusively CMYK 503, then the process is done 506. If it is, then if the document color characterization matches the device color characterization 504, the process is done 506. Otherwise, the document specification is transformed 505 before the process is done 506.

A device color characterization can have a signature. For example, many device color signatures are represented in the form of four vectors, one each for cyan, magenta, yellow, and black. The vector lengths are usually 256 or higher. Certain digital signaling or steganographic techniques that are well known to those practiced in the arts of digital signals or in steganography, can be used to embed a device signature or identification into a document specification or into a document color characterization. Another example is that, in order to combat counterfeiting, many printing devices produce a unique pattern on every document they print. Patterns of barely noticeable set of small yellow circles have been used. The presence of such a pattern can indicate that a document specification matches a certain printer.

A device signature can be discovered instead of intentionally placed. Many signals, device color characterizations can be treated as signals, contain identifying patterns. Those practiced in the arts of digital signaling, pattern recognition, and systems analysis are familiar with many techniques, such as eigen analysis and automated feature extraction, that can discover device signatures.

Figure 6:
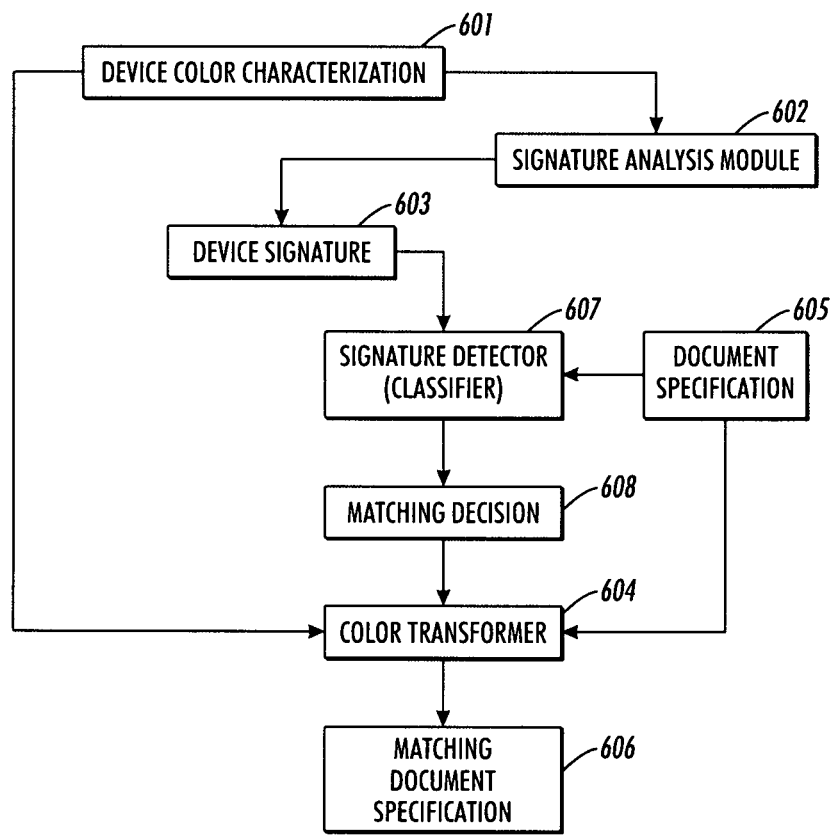
FIG. 6 illustrates analyzing color characterizations to produce a matching decision in accordance with aspects of the embodiments.

FIG. 6 illustrates analyzing color characterizations to produce a matching decision in accordance with aspects of the embodiments. A signature analysis module 602 can discover the device signature 603 in a device color characterization 601. Note that discovery is not needed if the device signature 603 is intentionally placed into the device color characterization 601. A signal detector, or classifier, 607 produce a matching decision 608 by examining a document specification 605 to determine if it contains the device signature 603. A color transformer 604 can transform the document specification 605 to produce a matching document specification 606. Clearly, if the document specification 605 already matches, then it is already a matching document specification 606.

Embodiments can be implemented in the context of modules. In the computer programming arts, a module can be typically implemented as a collection of routines and data structures that performs particular tasks or implements a particular abstract data type. Modules generally can be composed of two parts. First, a software module may list the constants, data types, variable, routines and the like that can be accessed by other modules or routines. Second, a software module can be configured as an implementation, which can be private (i.e., accessible perhaps only to the module), and that contains the source code that actually implements the routines or subroutines upon which the module is based. Thus, for example, the term module, as utilized herein generally refers to software modules, hardware modules, or implementations thereof. Such modules can be utilized separately or together to form a program product that can be implemented through signal-bearing media, including transmission media and recordable media.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method comprising:

obtaining a document specification from a document server wherein the document specification specifies a document;

examining metadata of a document color characterization associated with the document specification to determine if the document color characterization already matches a device color characterization wherein a rendering device is associated with the device color characterization and wherein the metadata indicates that the document color characterization matches the device color characterization such that alteration to the document color characterization is not needed in order for the rendering device to faithfully produce the document;

performing a color transformation to produce another document color characterization associated with the document specification only if the document color characterization does not match the device color characterization; and rendering the document on the rendering device wherein the document is faithfully rendered because the document specification is associated with a color characterization matching the device color characterization.

2. The method of claim 1 further comprising:

detecting if the document specification is exclusively CMYK; and performing the color transformation on the document specification only if the document specification is exclusively CMYK.

3. The method of claim 1 further comprising performing the color transformation only if the document color characterization is exclusively CMYK wherein the color transformation transforms the document color characterization to thereby also transform the document specification.

4. The method of claim 1 wherein the document specification comprises the document color characterization.

5. The method of claim 1 wherein the color transformation comprises adding a metadata value to the document specification wherein the metadata value specifies that the rendering device can use the document color characterization to faithfully render the document.

6. The method of claim 1 wherein the document color characterization matches the device color characterization when the document specification comprises a metadata value specifying that the rendering device can use the document color characterization to faithfully render the document.

7. The method of claim 1 wherein the device color characterization comprises at least one vector, wherein a device signature is embedded within the at least one vector; wherein the document specification matches the device color characterization if the document color characterization also comprises the device signature; and wherein the device signature is not a metadata value or flag.

8. A method comprising:

obtaining a document specification stored in association with a plurality of document color characterizations wherein the document specification specifies a document;

classifying each of the plurality of document color characterizations as either a matching characterization or as a nonmatching characterization wherein every matching characterization matches a device color characterization associated with at east one rendering device and wherein each nonmatching characterization does not match the device color characterization and wherein a matching characterization is an indication that alteration to a document color characterization is not needed in order for the document to be faithfully rendered by at least one of the at least one rendering device;

only if every document color characterization is a nonmatching characterization, performing a color transformation on one of the plurality of document color characterizations to thereby produce a matching characterization and associating the matching characterization with the document specification; and rendering the document.

9. The method of claim 8 further comprising:

detecting if the document specification is exclusively CMYK; and performing the color transformation only if the document specification is exclusively CMYK.

10. The method of claim 8 further comprising performing the color transformation only on an exclusively CMYK document characterization.

11. The method of claim 8 wherein the color transformation comprises adding a metadata value to the nonmatching characterization wherein the metadata value indicates that the nonmatching characterization is now a matching characterization by specifying that the at least one rendering device can use the now matching characterization to faithfully render the document.

12. The method of claim 8 wherein any of the document color characterization comprising a metadata value specifying that the at least one rendering device can use the document color characterization to faithfully render the document is classified as a matching characterization.

13. The method of claim 8 wherein the device color characterization comprises a device signature; wherein any of the document color characterization comprising the device signature is classified as a matching characterization: and wherein the device signature is not a metadata value or flag.

14. The method of claim 11 further comprising:

detecting if the nonmatching characterization is exclusively CMYK; and performing the color transformation only if the document color characterization is exclusively CMYK;

wherein the color transformation comprises adding a matching metadata value to the nonmatching characterization to thereby indicate that the at least one rendering device can use the now matching characterization to faithfully render the document;

wherein any of the document color characterization comprising the matching metadata value is classified as a matching characterization;

wherein the device color characterization comprises a device signature;

wherein any of the document color characterization comprising the device signature is classified as a matching characterization; and wherein the device signature is not a metadata value or flag.

* * * * *